United States Patent
Noda

(10) Patent No.: US 12,426,225 B2
(45) Date of Patent: Sep. 23, 2025

(54) COMPONENT MOUNTING LINE

(71) Applicant: FUJI CORPORATION, Chiryu (JP)

(72) Inventor: Akihiro Noda, Anjo (JP)

(73) Assignee: FUJI CORPORATION, Chiryu (JP)

(*) Notice: Subject to any disclaimer, the term of this patent is extended or adjusted under 35 U.S.C. 154(b) by 584 days.

(21) Appl. No.: 17/791,781

(22) PCT Filed: Jan. 16, 2020

(86) PCT No.: PCT/JP2020/001284
§ 371 (c)(1),
(2) Date: Jul. 8, 2022

(87) PCT Pub. No.: WO2021/144921
PCT Pub. Date: Jul. 22, 2021

(65) Prior Publication Data
US 2023/0033844 A1    Feb. 2, 2023

(51) Int. Cl.
*B23P 19/00*     (2006.01)
*G11C 5/12*     (2006.01)
(Continued)

(52) U.S. Cl.
CPC ..... *H05K 13/0069* (2013.01); *H05K 13/0015* (2013.01); *H05K 13/021* (2013.01);
(Continued)

(58) Field of Classification Search
CPC .......... H05K 13/0015; H05K 13/0069; H05K 13/021; H05K 13/022; H05K 13/0409;
(Continued)

(56) References Cited

U.S. PATENT DOCUMENTS 11,297,751 B2 * 4/2022 Kuroda ................ H05K 13/021
11,751,374 B2 * 9/2023 Mizuno ............. H05K 13/0417
340/679
(Continued)

FOREIGN PATENT DOCUMENTS

CN         107072136 A    8/2017
JP        2004-186454 A   7/2004
(Continued)

OTHER PUBLICATIONS

International Search Report issued Mar. 31, 2020 in PCT/JP2020/001284, filed on Jan. 16, 2020, citing documents AA & AO-AR therein, 2 pages.

*Primary Examiner* — Paul D Kim
(74) *Attorney, Agent, or Firm* — Oblon, McClelland, Maier &Neustadt, L.L.P.

(57) ABSTRACT

A production management device, which manages a production schedule of a component mounting line, executes a remote operation mode for remotely operating a component mounter to perform a test operation according to an input operation of an operator, in addition to an automatic production mode in which an automated replacement operation of an automated replacement robot is managed according to the production schedule to produce a component mounting board. The production management device determines, when in the remote operation mode, whether a feeder configured to supply components necessary for the test operation is set in the component mounter, and when the feeder that supplies the necessary components is not set in the component mounter, moves the automated replacement robot to the component mounter and sets the feeder configured to supply the necessary components in the component mounter to cause the component mounter to perform the test operation.

4 Claims, 5 Drawing Sheets

(51) Int. Cl.
  *H05K 13/00* (2006.01)
  *H05K 13/02* (2006.01)
  *H05K 13/04* (2006.01)
  *H05K 13/08* (2006.01)
(52) U.S. Cl.
  CPC ....... *H05K 13/022* (2013.01); *H05K 13/0409* (2018.08); *H05K 13/0413* (2013.01); *H05K 13/085* (2018.08); *H05K 13/086* (2018.08)
(58) Field of Classification Search
  CPC ........... H05K 13/0413; H05K 13/0882; H05K 13/085; H05K 13/086; Y02P 90/02
  See application file for complete search history.

(56) References Cited

U.S. PATENT DOCUMENTS

| 11,943,870 B2 * | 3/2024 | Kawai ................. H05K 13/021 |
| 2017/0038752 A1 | 2/2017 | Iisaka et al. | |

FOREIGN PATENT DOCUMENTS

| JP | 2017-34009 A | 2/2017 |
| JP | 2017-34142 A | 2/2017 |
| JP | 2018-125357 A | 8/2018 |
| WO | WO 2016/035145 A1 | 3/2016 |
| WO | WO 2018/185864 A1 | 10/2018 |

* cited by examiner

COMPONENT MOUNTING LINE

TECHNICAL FIELD

The present specification discloses a technology related to a component mounting line including an automated replacement robot that moves along an arrangement of multiple component mounters and automatically replaces a feeder for supplying components to each component mounter.

BACKGROUND ART

In recent years, in a component mounting line for producing a component mounting board, for example, as described in Patent Literature 1 (International Publication No. WO2016/035145), an automated replacement robot for automatically replacing a feeder for supplying components to multiple component mounters constituting the component mounting line has been installed, and a component mounting board is produced by automatically replacing the feeder for each component mounter according to a production schedule.

PATENT LITERATURE

Patent Literature 1: International Publication No. WO2016/035145

BRIEF SUMMARY

Technical Problem

Before starting the production, there is a case where each component mounter is caused to perform a test operation in order to confirm that a component pickup/mounting operation, image processing, or the like of each component mounter is normally performed. In addition, in a case where any component mounter stops in error or any trouble occurs therein during the production, it may be necessary for the component mounter to perform a test operation to clarify the cause of the erroneous stop or the trouble.

In a case where the component mounter is subjected to the test operation, an operator input-operates an execution of the test operation to a production management computer (host computer) that manages the production of the component mounting line, thereby remotely operating the component mounter, so that the component mounter performs the test operation. At this time, in a case where a feeder for supplying the components necessary for the test operation of the component mounter to be remotely operated is not set in the component mounter, the operator has to go to the component mounter to manually set the feeder for supplying the necessary components in the component mounter, which is cumbersome. Since the automated replacement robot merely automatically replaces the feeder according to the production schedule, the operator must manually perform the replacement operation of the feeder in a case where the component mounter is remotely operated.

Solution to Problem

In order to solve the above-mentioned problems, there is provided a component mounting line for mounting components on a circuit board to produce a component mounting board in each component mounter by arranging multiple component mounters in a conveyance path for conveying the circuit board, the component mounting line including an automated replacement robot configured to move along the arrangement of the multiple component mounters and automatically replace a feeder configured to supply components to each component mounter; and a production management device configured to manage a production schedule of the component mounting line, in which the production management device is configured to execute a remote operation mode for remotely operating the component mounter to perform a test operation of the component mounter according to an input operation of an operator, in addition to an automatic production mode in which an automated replacement operation of the automated replacement robot is managed according to the production schedule to produce the component mounting board, determines, when the operator performs an input operation for switching to the remote operation mode, whether a feeder configured to supply components necessary for the test operation of the component mounter to be remotely operated is set in the component mounter, and when the feeder that supplies the necessary components is not set in the component mounter, moves the automated replacement robot to the component mounter and sets the feeder configured to supply the necessary components in the component mounter to cause the component mounter to perform the test operation.

According to this configuration, in a case where the operator performs the input operation of the production management device to remotely operate the component mounter to perform the test operation, since the automated replacement robot moves to the component mounter to set the feeder necessary for the test operation to allow the component mounter to perform the test operation, it is not necessary for the operator to manually perform the replacement operation of the feeder, so that the efficiency at the time of the remote operation can be improved.

DESCRIPTION OF EMBODIMENTS

Hereinafter, an embodiment disclosed in the present specification will be described. First, a configuration of component mounting line 10 will be described based on FIGS. 1 and 2.

Component mounting line 10 is configured by arranging multiple component mounters 12 in a row along X-direction that is a conveyance direction of circuit board 11, and a solder printer (not illustrated) for printing solder on circuit board 11, feeder storage device 19 for storing cassette-type feeder 14 for supplying the component, and the like are installed on a board carrying-in side of component mounting line 10.

Figure 1:
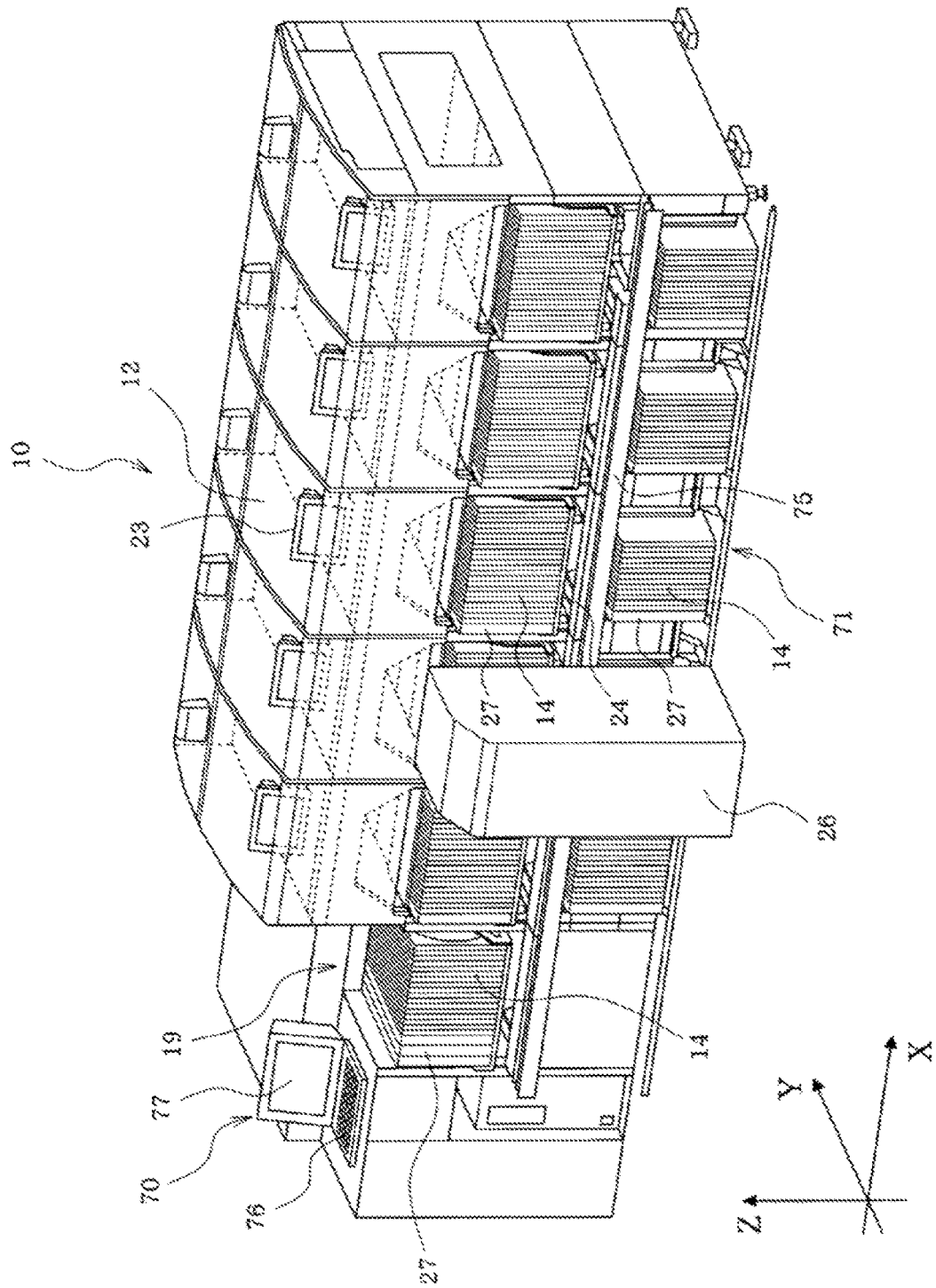
FIG. 1 is a perspective view illustrating an entire configuration of a component mounting line in an embodiment.
Figure 2:
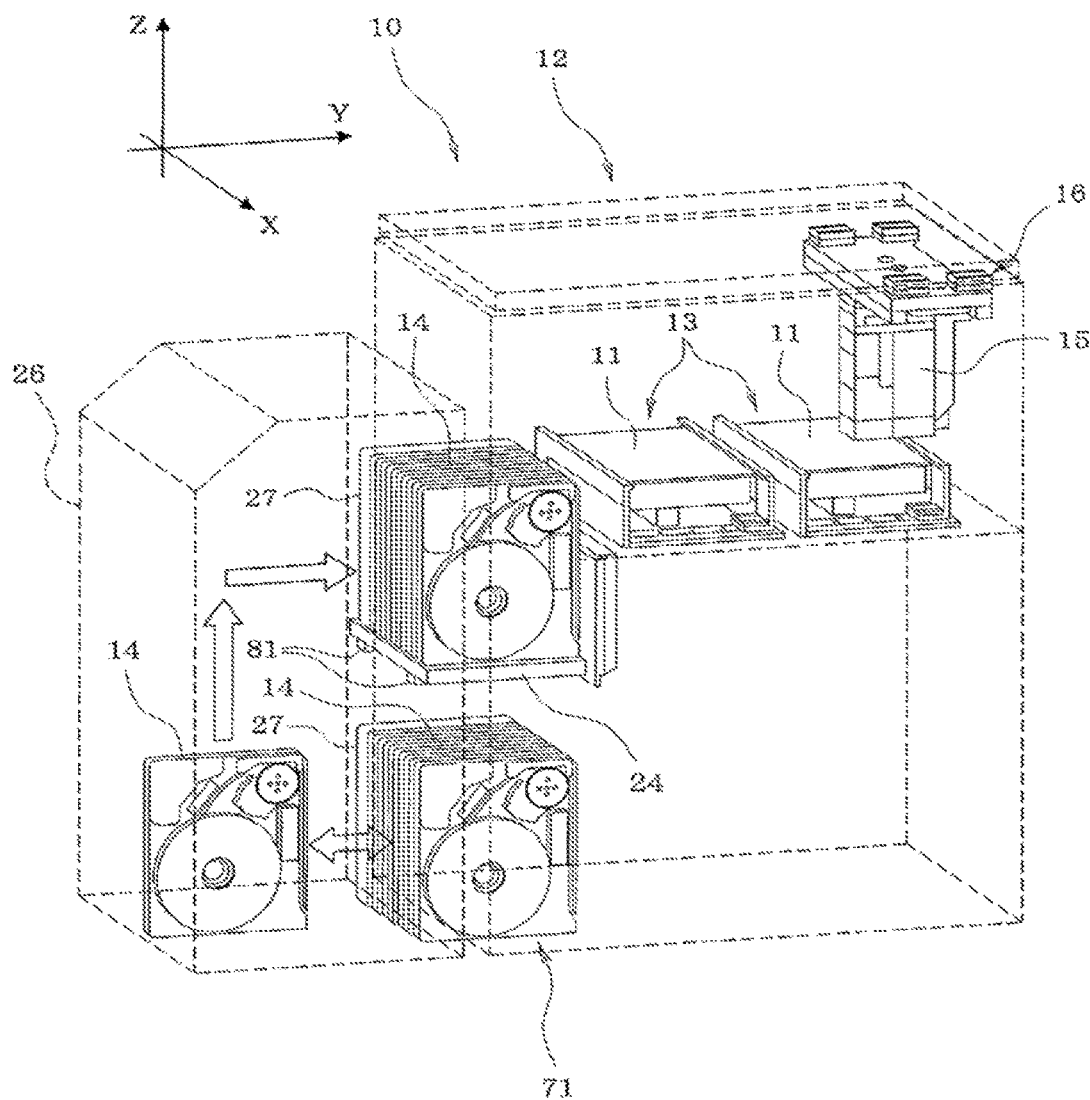
FIG. 2 is a perspective view schematically illustrating configurations of an automated replacement robot and a component mounter.

As illustrated of FIG. 2, each component mounter 12 is provided with two conveyors 13 for conveying circuit board 11, feeder setting base 24 (see FIG. 1) for replaceably setting multiple cassette-type feeders 14, mounting head 15 for holding suction nozzles (not illustrated) for picking up a component supplied from cassette-type feeder 14 set on feeder setting base 24 and mounting the same on circuit board 11, head moving device 16 for moving mounting head 15 in XY-directions (left-right and front-rear directions), component imaging camera 17 (see FIG. 3) for imaging the component picked up by the suction nozzles from below, and the like. Mark imaging camera 18 (see FIG. 3) for imaging a reference mark (not illustrated) of circuit board 11 is attached to head moving device 16 so as to move integrally with mounting head 15 in XY-directions.

Figure 3:
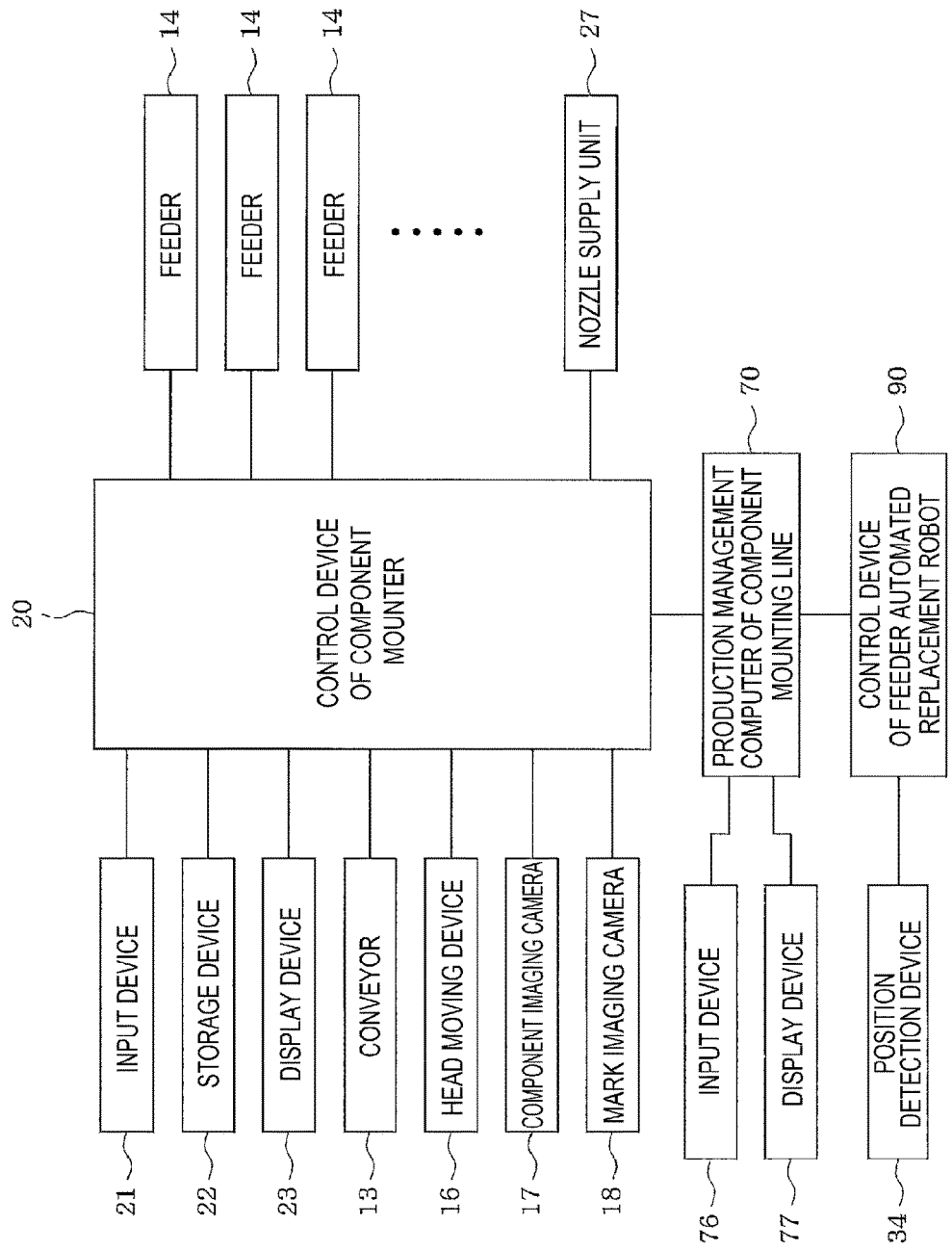
FIG. 3 is a block diagram schematically illustrating a configuration of a control system of the component mounting line with the automated replacement robot.

In addition, as illustrated of FIG. 3, input device 21 such as a keyboard, a mouse, and a touch panel, storage device 22 such as an HDD, an SSD, a ROM, or a RAM, for storing various programs and various data for control, display device 23 such as a liquid crystal display or an organic EL display, and the like are provided in control device 20 of component mounter 12. Control device 20 of each component mounter 12 is connected, via a network, to production management computer 70 (production management device) that manages a production schedule of component mounting line 10, such that the production of each component mounter 12 of component mounting line 10 is managed by production management computer 70. Production management computer 70 is also provided with input device 76 such as a keyboard, a mouse, and a touch panel, and display device 77 such as a liquid crystal display and an organic EL display.

Each component mounter 12 of component mounting line 10 conveys circuit board 11 conveyed from upstream component mounter 12 to a predetermined position with conveyor 13, clamps circuit board 11 with a clamping mechanism (not illustrated), images a reference mark of circuit board 11 with mark imaging camera 18, recognizes a position (reference position of circuit board 11) of the reference mark, picks up the component supplied from each feeder 14 with the suction nozzle of mounting head 15, moves the component from a pickup position to an imaging position, images the component from below with component imaging camera 17, determines a pickup positional deviation amount of the component, or the like, and then moves mounting head 15 to correct the pickup positional deviation amount, and mounts the component on a predetermined position of circuit board 11 on conveyor 13 to produce the component mounting board.

As illustrated of FIG. 1, automated replacement robot 26 for setting and/or detaching (hereinafter, referred to as "automated replacement") feeder 14 to and from feeder setting base 24 of each component mounter 12 is installed on the front side of component mounting line 10. Stock section 71 for accommodating multiple feeders 14 to be set in feeder setting base 24 is provided below feeder setting base 24 of each component mounter 12.

Production management computer 70 manages the production (placement of feeder 14, component shortage, or the like) of each component mounter 12 of component mounting line 10 according to the production schedule, and instructs component mounter 12 that requires automated replacement of feeder 14 for control device 90 of automated replacement robot 26 when automated replacement of feeder 14 is required in any component mounter 12, automated replacement robot 26 moves to the front side of instructed component mounter 12, takes out feeder 14 of a replacement target from feeder setting base 24 of component mounter 12, collects feeder 14 in stock section 71, and takes out necessary feeder 14 from stock section 71 to set feeder 14 in feeder setting base 24. Automated replacement robot 26 may perform only an operation of collecting feeder 14 taken out from feeder setting base 24 into stock section 71 in response to the automated replacement instruction, or conversely, may perform only an operation of setting feeder 14 taken out from stock section 71 in a free slot of feeder setting base 24.

On the front side of component mounting line 10, guide rail 75 for moving automated replacement robot 26 in X-direction (right-left direction) along the arrangement of component mounters 12 is provided so as to extend in X-direction over entire component mounting line 10. The board carrying-in side of guide rail 75 extends to feeder storage device 19, and automated replacement robot 26 moves to the front side of feeder storage device 19, so that automated replacement robot 26 takes out feeder 14 required for the automated replacement from feeder storage device 19 or returns used feeder 14 into feeder storage device 19.

Automated replacement robot 26 is provided with position detection device 34 (see FIG. 3) for detecting the position of automated replacement robot 26 with respect to component mounting line 10. When the automated replacement of feeder 14 of any of component mounters 12 is instructed by production management computer 70, control device 90 of automated replacement robot 26 is configured to move to the front side of component mounter 12 to which the automated replacement of feeder 14 is instructed while detecting the position of automated replacement robot 26 by a detected signal of position detection device 34 and controls an operation of performing the automated replacement of feeder 14.

In addition to the automated replacement of feeder 14, automated replacement robot 26 is configured to be capable of automatically replacing cassette-type nozzle replacement unit 27 accommodating the suction nozzle for replacement, with respect to feeder setting base 24. Nozzle replacement unit 27 that requires the automated replacement and used nozzle replacement unit 27 are stored in the feeder storage device 19 and stock section 71 side by side with feeder 14.

Figure 4:
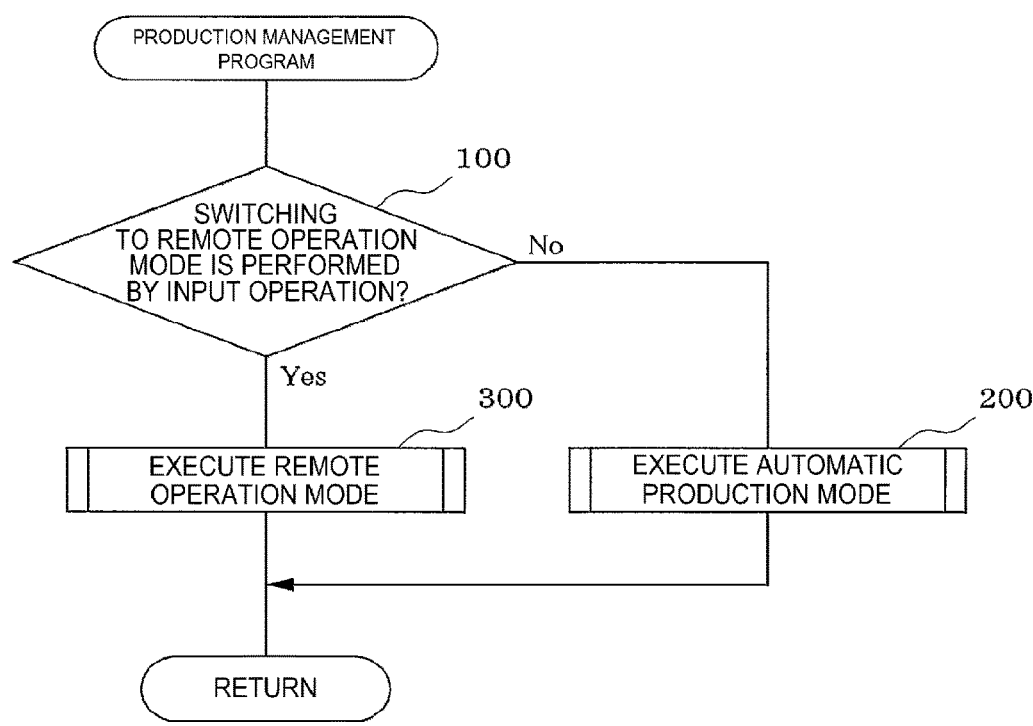
FIG. 4 is a flowchart illustrating a processing flow of a production management program.

Production management computer 70 can execute a remote operation mode for remotely operating component mounter 12 to perform a test operation according to an input operation of input device 76 by the operator in addition to an automatic production mode in which the automated replacement operation of automated replacement robot 26 is managed according to the production schedule to produce the component mounting board by executing a production management program of FIG. 4 which is described later. Here, the test operation of component mounter 12 includes, for example, the followings.

(1) The component is picked up by the suction nozzle, the pickup state of the component is imaged by component imaging camera 17, and the image thereof is processed to inspect the pickup state (deviation amount of the pickup position and pickup posture) of the component.

(2) It is determined whether the component image imaged by component imaging camera 17 can be processed to be correctly recognized, and it is inspected whether the image processing data used for the image processing is appropriate (whether correction of the image processing data is unnecessary).

(3) In order to optimize a conveyance parameter (speed, acceleration and deceleration, or the like) when the component is picked up by the suction nozzle and conveyed, operations of conveying the component picked up by the suction nozzle by gradually changing the conveyance parameter and confirming the presence or absence of the positional deviation of the component by image processing are repeated to obtain the fastest conveyance parameter within a range in which the component can be stably conveyed without positional deviation during conveyance.

Next, the processing contents of the production management program of FIG. 4 executed by production management computer 70 and the remote operation mode execution program of FIG. 5 will be described.

The production management program of FIG. 4 is repeatedly executed at predetermined cycles while the power source of production management computer 70 is turned on. Production management computer 70 activates the production management program of FIG. 4. First, in step 100, it is determined whether an input operation for switching to the remote operation mode by operating input device 76 of production management computer 70 is performed by the operator, and in a case where the input operation is not performed, the processing proceeds to step 200, and an automatic production mode is executed. In the automatic production mode, the automated replacement operation of automated replacement robot 26 is managed according to the production schedule, feeder 14 is automatically replaced with respect to each component mounter 12, and components are mounted on circuit board 11 by each component mounter 12 to produce the component mounting board.

Figure 5:
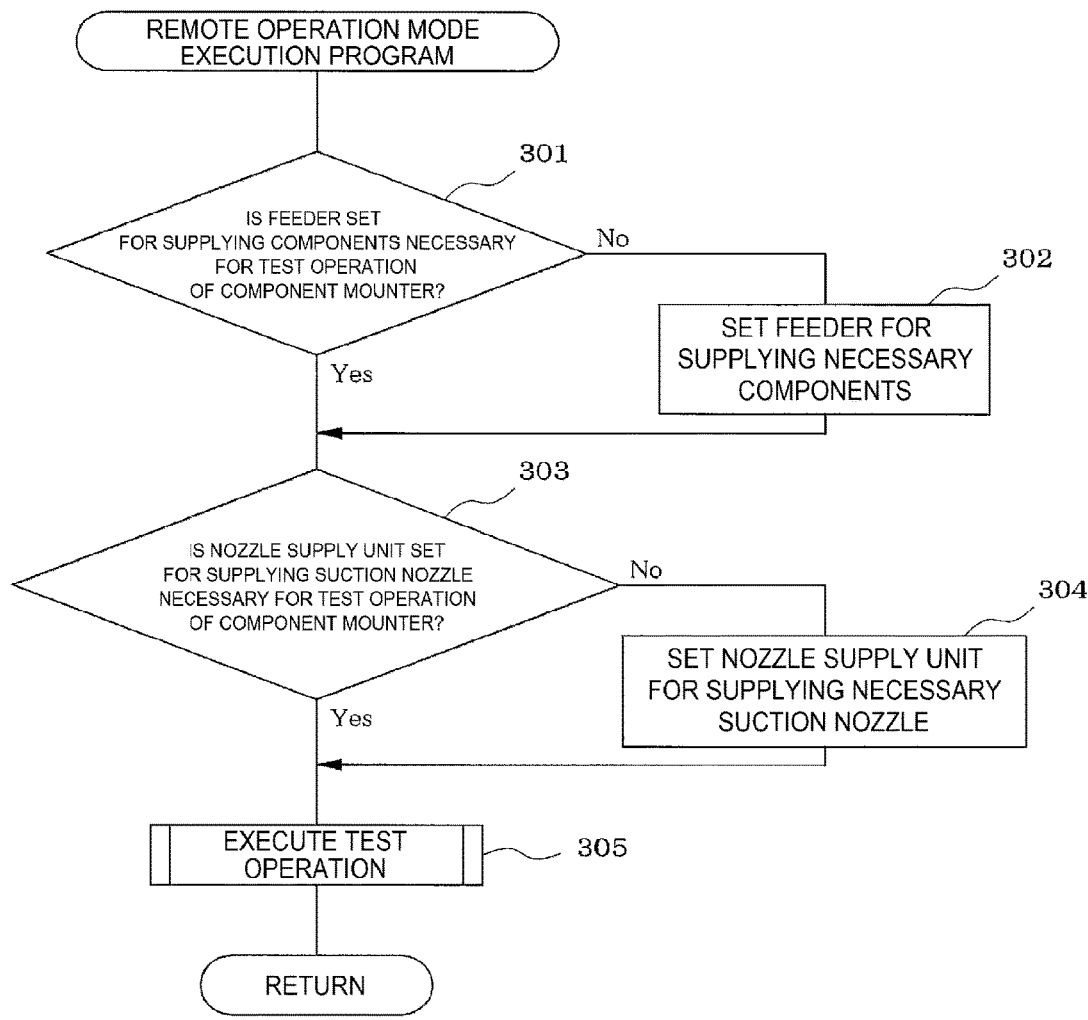
FIG. 5 is a flowchart illustrating a processing flow of a remote operation mode execution program.

On the other hand, in the above-described step 100, if it is determined that the input operation for switching to the remote operation mode has been performed, the processing proceeds to step 300, where the mode is switched to the remote operation mode, and the remote operation mode execution program of FIG. 5 is executed.

In the remote operation mode execution program, first, in step 301, it is determined whether feeder 14 for supplying the components necessary for the test operation of component mounter 12 to be remotely operated is set in component mounter 12. When the operator performs the input operation to switch to the remote operation mode at the time of switching the production schedule, the components necessary for the test operation of component mounter 12 to be remotely operated are components with necessity of the test (for example, components that have not been used) among the components used by component mounter 12 in the next production schedule.

In the above-described step 301, in a case where it is determined that feeder 14 for supplying the components necessary for the test operation of component mounter 12 to be remotely operated is set in component mounter 12, the processing proceeds to determination processing of step 303 which is described later, but in a case where it is determined that feeder 14 for supplying the necessary components is not set in component mounter 12, the processing proceeds to step 302, where automated replacement robot 26 is moved to the front side of component mounter 12 to set feeder 14 for supplying the necessary components in feeder setting base 24 of component mounter 12. At this time, in a case where there is no free space (free slot) in feeder setting base 24 of component mounter 12, automated replacement robot 26 takes out feeder 14 or nozzle supply unit 27 not used for the test operation from feeder setting base 24, and then sets feeder 14 for supplying necessary components.

Thereafter, the processing proceeds to step 303, where it is determined whether nozzle supply unit 27 for supplying the suction nozzle necessary for the test operation of component mounter 12 to be remotely operated is set in component mounter 12. When the operator performs the input operation to switch to the remote operation mode at the time of switching the production schedule, the suction nozzle necessary for the test operation of component mounter 12 to be remotely operated is a suction nozzle with necessity of the test (for example, the suction nozzle that has not been used) among the suction nozzles used by component mounter 12 in the next production schedule.

In the above-described step 303, in a case where it is determined that nozzle supply unit 27 for supplying the suction nozzle necessary for the test operation of component mounter 12 to be remotely operated is set in component mounter 12, the processing proceeds to step 305, where component mounter 12 is caused to perform the test operation.

On the other hand, in step 303, in a case where it is determined that nozzle supply unit 27 for supplying the suction nozzle necessary for the test operation of component mounter 12 to be remotely operated is not set in component mounter 12, the processing proceeds to step 304, where automated replacement robot 26 is moved to the front side of component mounter 12 to set nozzle supply unit 27 for supplying the necessary suction nozzle in feeder setting base 24 of component mounter 12. At this time, in a case where there is no free space (free slot) in feeder setting base 24 of component mounter 12, automated replacement robot 26 takes out feeder 14 or nozzle supply unit 27 not used for the test operation from feeder setting base 24, and then sets nozzle supply unit 27 for supplying the necessary suction nozzle. Thereafter, the processing proceeds to step 305, where component mounter 12 is caused to perform the test operation.

According to the present embodiment described above, in a case where the operator operates input device 76 of production management computer 70 to remotely operate component mounter 12 to perform the test operation, since automated replacement robot 26 moves to the front side of component mounter 12 to set feeder 14 and/or nozzle supply unit 27 necessary for the test operation, it is not necessary for the operator to manually perform the replacement operation of feeder 14 and nozzle supply unit 27, so that the efficiency at the time of the remote operation can be improved.

In addition, the present disclosure is not limited to the configurations of the above embodiments, and it is needless to say that various changes can be made without departing from the gist, such as, for example, the configuration of component mounting line 10 may be appropriately changed, the configuration of component mounter 12 may be appropriately changed, or the configuration of automated replacement robot 26 may be appropriately changed.

REFERENCE SIGNS LIST

10: component mounting line, 11: circuit board, 12: component mounter, 14: feeder, 15: mounting head, 20: control device of component mounter, 24: feeder setting base, 26: automated replacement robot, 27: nozzle supply unit, 70: production management computer (production management device), 90: control device of feeder automated replacement robot

The invention claimed is:

1. A component mounting line for mounting components on a circuit board to produce a component mounting board by arranging multiple component mounters in a conveyance path for conveying the circuit board, the component mounting line comprising:
    an automated replacement robot configured to move along an arrangement of the multiple component mounters and automatically replace a feeder configured to supply the components to a component mounter of the multiple component mounters; and a production management device configured to manage a production schedule of the component mounting line, wherein the production management device is configured to execute a remote operation mode for remotely operating the component mounter to perform a test operation of the component mounter according to an input operation of an operator, in addition to an automatic production mode in which an automated replacement operation of the automated replacement robot is managed according to the production schedule to produce the component mounting board, determines, when the operator performs the input operation for switching to the remote operation mode, whether the feeder configured to supply the components necessary for the test operation of the component mounter to be remotely operated is set in the component mounter, and when the feeder that supplies necessary components is not set in the component mounter, moves the automated replacement robot to the component mounter and sets the feeder configured to supply the necessary components in the component mounter to cause the component mounter to perform the test operation.

2. The component mounting line according to claim 1, wherein each of the multiple component mounters is configured to automatically replace a suction nozzle configured to pick up the component, the automated replacement robot is configured to automatically replace a nozzle supply unit configured to supply the suction nozzle to each component mounter in addition to the automated replacement of the feeder, and the production management device determines, when the operator performs the input operation for switching to the remote operation mode, whether the nozzle supply unit configured to supply a necessary suction nozzle that is necessary for the test operation of the component mounter to be remotely operated is set in the component mounter, and when the nozzle supply unit configured to supply the necessary suction nozzle is not set in the component mounter, moves the automated replacement robot to the component mounter and sets the nozzle supply unit configured to supply the necessary suction nozzle in the component mounter to cause the component mounter to perform the test operation.

3. The component mounting line according to claim 2, wherein the production management device determines, when the operator performs the input operation for switching to the remote operation mode at a time of switching the production schedule, whether the feeder and/or a nozzle supply unit configured to supply a component and/or the necessary suction nozzle is set in the component mounter among the components and/or the suction nozzles used by the component mounter to be remotely operated in a next production schedule, and when the feeder and/or the nozzle supply unit configured to supply the necessary component and/or suction nozzle is not set in the component mounter, preferentially sets the feeder and/or the nozzle supply unit configured to supply the necessary component and/or suction nozzle in the component mounter by the automated replacement robot to cause the component mounter to perform the test operation.

4. The component mounting line according to claim 1, wherein the test operation of the component mounter is an operation of testing at least one of a pickup state of a component picked up by a suction nozzle, image processing of the component, or a conveyance parameter for conveying the component.

* * * * *